(12) United States Patent
Shukla et al.

(10) Patent No.: US 8,804,993 B2
(45) Date of Patent: Aug. 12, 2014

(54) AUDIO PORT CONFIGURATION FOR COMPACT ELECTRONIC DEVICES

(75) Inventors: Ashutosh Y. Shukla, Santa Clara, CA (US); Nicholas G. L. Merz, San Francisco, CA (US); Tang Yew Tan, San Francisco, CA (US); Pinida Jan Moolsintong, San Francisco, CA (US); Erik Wang, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 535 days.

(21) Appl. No.: 13/163,308

(22) Filed: Jun. 17, 2011

(65) Prior Publication Data

US 2012/0177237 A1    Jul. 12, 2012

Related U.S. Application Data

(60) Provisional application No. 61/431,347, filed on Jan. 10, 2011.

(51) Int. Cl.
*H04R 25/00* (2006.01)
*B29C 45/16* (2006.01)
*H04M 1/03* (2006.01)
*H04R 1/34* (2006.01)
*B29L 31/34* (2006.01)
*H05K 1/18* (2006.01)
*H04M 1/18* (2006.01)

(52) U.S. Cl.
CPC ........ *H04M 1/035* (2013.01); *B29L 2031/3437* (2013.01); *B29C 45/1671* (2013.01); *B29L 2031/3418* (2013.01); *H05K 2201/10083* (2013.01); *H05K 1/189* (2013.01); *H04R 1/34* (2013.01); *H04M 1/18* (2013.01); *B29C 45/1676* (2013.01)
USPC ........................... 381/386; 381/334; 381/189

(58) Field of Classification Search
USPC ......... 381/332, 334, 335, 337, 338, 345, 353, 381/354, 386, 391, 189, 392; 379/388.01, 379/388.02, 420.02, 430, 433.02, 432; 455/575.1, 569.1
See application file for complete search history.

(56) References Cited

U.S. PATENT DOCUMENTS 5,790,679 A * 8/1998 Hawker et al. ................ 381/163
6,002,949 A * 12/1999 Hawker et al. ........... 379/433.02

(Continued)

FOREIGN PATENT DOCUMENTS

DE           11 47 983 B      5/1963
DE       20 2004 011510      12/2004
EP             1 686 834 A1   8/2006

*Primary Examiner* — Huyen D Le
(74) *Attorney, Agent, or Firm* — Brownstein Hyatt Farber Schreck, LLP

(57) ABSTRACT

A portable electronic device that provides compact configurations for audio elements are disclosed. The audio elements can be drivers (e.g., speakers) or receivers (e.g., microphones). In one embodiment, a molded acoustic chamber can be formed to assist in directing audio sound between an opening an outer housing and an internal flexible electronic substrate. The audio element can be mounted on or coupled to the flexible electrical substrate over an opening therein that allows allow audio sound to pass there through. The molded acoustic chamber can also be formed such that it includes a barrier, such as a mesh barrier, so that undesired foreign substances can be blocked from entry or further entry into the audio chamber. The molded acoustic chamber can also be formed such that it includes one or more acoustic seals that can be used to provide an acoustic seal between the molded acoustic chamber and the opening in the outer housing.

17 Claims, 14 Drawing Sheets

(56) References Cited

U.S. PATENT DOCUMENTS

| | | |
|---|---|---|
| 6,321,070 B1 | 11/2001 | Clark et al. |
| 6,785,395 B1 * | 8/2004 | Arneson et al. ............... 381/334 |
| 7,358,663 B2 | 4/2008 | Kweon et al. |
| 2006/0094378 A1 | 5/2006 | Murrary et al. |
| 2006/0153417 A1 | 7/2006 | Furuya |
| 2006/0188126 A1 | 8/2006 | Andersen et al. |
| 2008/0149417 A1 | 6/2008 | Dinh et al. |
| 2010/0231060 A1 | 9/2010 | Bang et al. |

* cited by examiner

AUDIO PORT CONFIGURATION FOR COMPACT ELECTRONIC DEVICES

CROSS-REFERENCE TO RELATED APPLICATION

This application claims priority benefit of U.S. Provisional Application No. 61/431,347, filed Jan. 10, 2011 and entitled "AUDIO PORT CONFIGURATION FOR COMPACT ELECTRONIC DEVICES," which is hereby incorporated herein by reference.

BACKGROUND OF THE INVENTION

1. Field of the Invention

The present invention relates to audio ports for electronic devices and, more particularly, for audio port configurations for compact electronic devices.

2. Description of the Related Art

Today, it is popular for portable electronic devices, such as notebook computers, netbook computers, portable digital assistants (PDAs), smart phones, digital audio players (e.g., MP3 players) and the like, include at least one speaker to produce audio sound output and at least one microphone to receive audio sound input.

Portable electronic devices often provide audio jacks (i.e., audio connectors) that facilitate connection with headsets or headphones which provide personal external speakers for their users. Portable electronic devices can provide one or more internal speakers that are able to be utilized for producing audio sound. Similarly, portable electronic devices can have a microphone jack that facilitates connection with a microphone which can be externally provided for a user. Portable electronic device can also provide one or more internal microphones that are able to be used to pickup (i.e., receive) audio sound.

There is, however, an ongoing need to make portable electronic devices smaller and thinner. As portable electronic devices get smaller and thinner, there are increased difficulties in providing the same or greater functionality in a smaller area. With respect to audio sound, a portable electronic device can utilize one or more speakers and one or more microphones provided internal to the housing of the portable electronic device. Unfortunately, given the area constraints imposed on many portable electronic devices, it is increasingly difficult to provide high-quality audio sound output and pickup without hindering the ability to make portable electronic devices smaller and thinner. Consequently, there is a need for improved approaches to provide high-quality audio sound output and/or pickup from portable electronic devices as they get smaller and thinner.

SUMMARY

Embodiments of the invention pertain to a portable electronic device that provides compact configurations for audio elements. The audio elements can be drivers (e.g., speakers) or receivers (e.g., microphones). In one embodiment, a molded acoustic chamber can be formed to assist in directing audio sound between an opening an outer housing and an internal flexible electronic substrate. The audio element can be mounted on or coupled to the flexible electrical substrate over an opening therein that allows allow audio sound to pass there through. The molded acoustic chamber can also be formed such that it includes a barrier, such as a mesh barrier, so that undesired foreign substances can be blocked from entry or further entry into the audio chamber. The molded acoustic chamber can also be formed such that it includes one or more acoustic seals that can be used to provide an acoustic seal between the molded acoustic chamber and the opening in the outer housing.

The invention can be implemented in numerous ways, including as a method, system, device, or apparatus. Several embodiments of the invention are discussed below.

According to one embodiment, a portable electronic device can include a housing having an inner surface and an outer surface, with the housing having an audio port opening. A flexible substrate, an audio component and a molded acoustic chamber can be provided within the housing. The flexible substrate can include a first side and a second side, and the flexible substrate can include a substrate opening there through. The audio component can be coupled to the first side of the flexible substrate adjacent the substrate opening. The molded acoustic chamber can have an internal audio channel through the molded acoustic chamber from a first end to a second end. The second end of the molded acoustic chamber can be more compliant (i.e., less rigid) than the first end. In addition, the first end of the molded acoustic chamber can be acoustically sealed to the second side of the flexible substrate adjacent the substrate opening, and the second end of the molded acoustic chamber can be acoustically sealed to the inner surface of the housing adjacent the audio port opening.

According to another embodiment, a portable electronic device can include a housing having an inner surface and an outer surface, with the housing having an audio port opening. A flexible substrate, an audio component and a molded acoustic chamber can be provided within the housing. The flexible substrate can include a first side and a second side, and the flexible substrate can include a substrate opening there through. The audio component can be coupled to the first side of the flexible substrate adjacent the substrate opening. A molded acoustic chamber can have an internal audio channel through the molded acoustic chamber from a first end to a second end. A mesh barrier can also be integrally molded with the second end of the molded acoustic audio chamber. The first end of the molded acoustic chamber can be acoustically sealed to the second side of the flexible substrate adjacent the substrate opening, and the second end of the molded acoustic chamber can be acoustically sealed to the inner surface of the housing adjacent the audio port opening.

According to one embodiment, a molded acoustic chamber can provide an audio channel from an audio component to an audio port opening. The molded acoustic chamber can include: a first portion having a first end, the first portion being molded from a first material; a second portion having a second end, the second portion being molded from a second material; an internal audio channel through the molded acoustic chamber from the first end to the second end; and a mesh provided at the second portion of the molded acoustic chamber.

According to one embodiment, a method can pertain to forming an acoustic chamber for use in a portable electronic device. The acoustic chamber can provide an audio channel from an audio component internal to the portable electronic device to an audio port opening in an outer housing for the portable electronic device. The method can include at least: configuring a mold to form a first portion of an acoustic chamber; injecting a first material into the mold to form the first portion of the acoustic chamber; reconfiguring the mold to form a second portion of the acoustic chamber; and injecting a second material into the reconfigured mold to form the second portion of the acoustic chamber. Also, when the second portion of the acoustic chamber is formed, the second portion of the acoustic chamber can be bonded to the first portion of the acoustic chamber and has the audio channel extending there through. Further, the second portion that is formed can include at least one seal integrally formed to at least participate in sealing the second portion to an inner surface of the outer housing for the portable electronic device.

According to one embodiment, a method can pertain to assembling an audio subsystem for use in a portable electronic device. The method can include at least: providing a molded acoustic chamber including at least a first portion having a first end, a second portion having a second end, an internal audio channel through the molded acoustic chamber from the first end to the second end, and a mesh provided within or adjacent the internal audio channel. The method can also include providing a flexible substrate for electrical circuitry, the flexible substrate including a first side and a second side, the flexible substrate including a substrate opening there through. The method can also include attaching an audio component coupled to the first side of the flexible substrate adjacent the substrate opening, and acoustically coupling the first end of the molded acoustic chamber to the second side of the flexible substrate adjacent the substrate opening.

According to one embodiment, a portable electronic device can include a housing having an inner surface and an outer surface, and the housing can include an audio port opening. The portable electronic device can also include a cosmetic barrier having a first side and a second side, an audio component provided within the housing, an acoustic chamber provided within the housing, and an acoustic barrier. The acoustic chamber can have an internal audio channel through the acoustic chamber from a first end to a second end, with the second end of the acoustic chamber including a recessed portion. The acoustic barrier can be coupled to the acoustic chamber within the recessed portion. In addition, the first end of the acoustic chamber can be acoustically sealed to the audio component. Still further, the second side of the cosmetic barrier can be acoustically sealed to the inner surface of the housing adjacent the audio port opening, and the first side of the cosmetic barrier can be acoustically sealed to the second end of the acoustic chamber.

According to one embodiment, a portable electronic device can include a housing having an inner surface and an outer surface and also having an audio port opening. The portable electronic device can also include an acoustic chamber provided within the housing, and an audio component provided within the housing. The acoustic chamber can have an internal audio channel through the acoustic chamber from a first end to a second end. The second end of the acoustic chamber can include a first recessed portion and a second recessed portion, and the second side of the acoustic chamber can be acoustically sealed to the inner surface of the housing adjacent the audio port opening. The audio component can be acoustically sealed to the first end of the acoustic chamber. Still further, the portable electronic device can include an acoustic mesh barrier coupled to the acoustic chamber within the first recessed portion, and a cosmetic mesh barrier coupled to the acoustic chamber within the second recessed portion.

According to one embodiment, a portable electronic device can include at least: a housing having an inner region having a frame structure; a printed circuit substrate secured relative to the frame structure; a gyro detector for providing gyro data; a vibration isolation member; and an acoustic module including or acoustically coupling to a speaker. The acoustic module can be secured relative to the frame structure at least in part via the vibration isolation member. The vibration isolation member can reduce vibrations from the acoustic module that reach or influence the gyro detector.

According to one embodiment, a linear vibration motor device can include at least: a housing, an extended side portion integral with or coupled to the housing, and at least one contact coil provided at the extended side portion.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

It should be noted that FIGS. 1-12B are not necessarily drawn to scale. Instead, these figures are enlarged so that features are more readily visible.

DETAILED DESCRIPTION OF EMBODIMENTS OF THE INVENTION

The invention pertains to a portable electronic device that provides compact configurations for audio elements. The audio elements can be drivers (e.g., speakers) or receivers (e.g., microphones). In one embodiment, a molded acoustic chamber can be formed to assist in directing audio sound between an opening an outer housing and an internal flexible electronic substrate. The audio element can be mounted on or coupled to the flexible electrical substrate over an opening therein that allows allow audio sound to pass there through. The molded acoustic chamber can also be formed such that it includes a barrier, such as a mesh barrier, so that undesired foreign substances can be blocked from entry or further entry into the audio chamber. The molded acoustic chamber can also be formed such that it includes one or more acoustic seals that can be used to provide an acoustic seal between the molded acoustic chamber and the opening in the outer housing.

Exemplary embodiments of the invention are discussed below with reference to FIGS. 1-12B. However, those skilled in the art will readily appreciate that the detailed description given herein with respect to these figures is for explanatory purposes as the invention extends beyond these limited embodiments.

Figure 1:
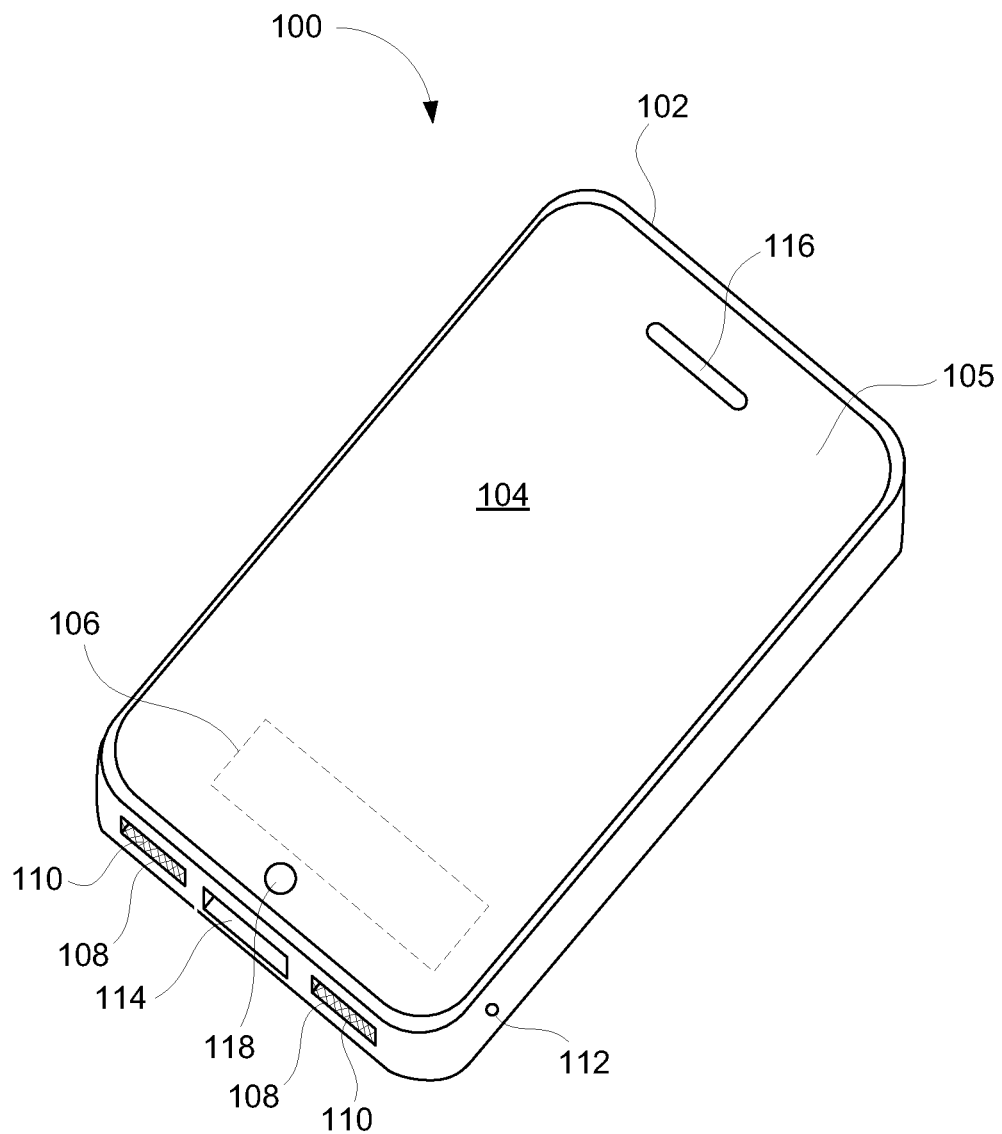
FIG. 1 is a perspective diagram of a portable electronic device according to one embodiment.

FIG. 1 is a perspective diagram of a portable electronic device 100 according to one embodiment. The portable electronic device 100 is a representative illustration for a portable electronic device. However, it should be understood that, in other embodiments, the size, scale, shape, configuration and/or appearance of the portable electronic device 100 can vary widely.

The portable electronic device 100 includes a housing 102 that provides an exterior surface for the portable electronic device 100. The portable electronic device 100 provides one or more functional capabilities that can be utilized by its user. In so doing, the portable electronic device can include at least one input/output component 104.

The user input/output component 104 typically includes one or more user input devices and/or one or more output device. The one or more user input devices can allow the user to interact with the portable electronic device. The one or more output devices can provide outputs from the portable electronic device to the user or another device. The input/output component 104 can, for example, pertain to one or more of a display, a touch screen, a touchpad, a keypad, a button, a dial, and etc. For example, the input/output component 104 can provide a display and a touch screen combination, with the display providing output capability and the touch screen providing input capability.

The portable electronic device 100 can also include an audio circuit 106. The audio circuit 106 is typically provided internal to the housing 102 of the portable electronic device 100. The audio circuit 106 can operate to produce audio signals that can be supplied to one or more speakers internal to the housing 102 of the portable electronic device 100. The one or more speakers, in response to the audio signals, can produce audio sound that can be directed (e.g., by way of one or more acoustic chambers) to one or more audio output openings 108 in the housing 102 of the portable electronic device 100. In one embodiment, each of the one or more audio output openings 108 can include a mesh cover 110 that serves to protect foreign matter from entering into the housing 102 of the portable electronic device 100 by way of the audio output opening 108.

The audio circuit 106 can also operate to receive audio signals that are picked-up by one or more microphones internal to the housing 102 of the portable electronic device 100. The one or more microphones can pick-up audio sounds that are received (e.g., directly or by way of one or more acoustic chambers) via an audio input opening 112 in the housing 102 of the portable electronic device 100. In general, the portable electronic device 100 can place the audio input opening 112 in any of various location. However, in this embodiment, the audio input opening 112 is provided on a side of the housing 102. In one embodiment, the audio input opening 112 can also include a mesh cover (not shown) that serves to protect foreign matter from entering into the housing 102 of the portable electronic device 100 by way of the audio input opening 112.

The housing 102 of the portable electronic device 100 can also include an external connection port 114. The external connection port 114 allows the portable electronic device 100 to be directly or indirectly connected to a host device (e.g., personal computer) or other electronic devices (e.g., docking station), so as to exchange data or to charge a battery (not shown) utilized by the portable electronic device 100.

The portable electronic device 100 can also include a receiver opening 116 and a button opening 118. The receiver opening 116 can be provided adjacent an internal receiver (e.g., speaker) that can provide audio output to a user of the portable electronic device 100. The button opening 118 can be provided adjacent a button that allows the user to interact with the portable electronic device 100. Although the receiver opening 116 and the button opening can be provided in the translucent face 105, it should be understood that these components could be provided elsewhere in the portable electronic device 100. For example, these components could be provided at the side of the portable electronic device 100. The translucent face 105 can be a glass sheet or a plastic sheet. The translucent face 105 provides a front face for the housing. The translucent face can also be thin, such as having a thickness of less than 1 millimeter.

The portable electronic device 100 can include any suitable type of electronic device having a display. For example, the portable electronic device 100 can be a laptop, tablet computer, media player, phone, GPS unit, remote control, personal digital assistant (PDA), and the like, and devices combining some or all of this functionality. Depending on the capabilities of the portable electronic device 100, internal to the portable electronic device 100 are various electrical components that serve support the device capabilities. The electronic components include one or more of integrated circuit(s), electronic substrate(s) (flex circuits, printed circuit boards), wireless transceiver(s), battery(s), microphone(s), speaker(s), display circuitry(s), touch circuitry(s), and connectors (e.g., ports), user input devices (button, switches, etc.).

According to one aspect, a portable electronic device can be provided with a compact configuration for audio elements. The audio elements can be drivers (e.g., speakers) or receivers (e.g., microphones). In one embodiment, an audio element can be mounted on or coupled to an intermediate structure (e.g., a flexible electrical substrate) having an opening therein to allow audio sound to pass there through. In another embodiment, an audio chamber can be formed to assist in directing audio sound between an opening an outer housing and a flexible electronic substrate to which the audio element is mounted or coupled thereto.

Figure 2A:
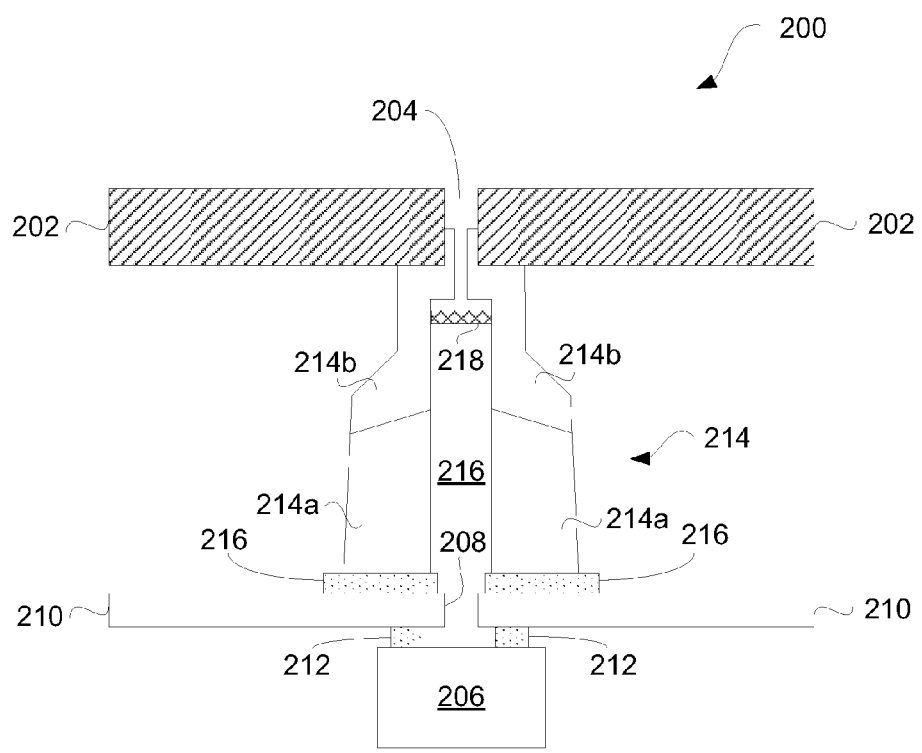
FIG. 2A is a partial cross-sectional diagram of a portable electronic device 200 according to one embodiment.

FIG. 2A is a partial cross-sectional diagram of a portable electronic device 200 according to one embodiment. The portable electronic device 200 includes a housing 202 for the portable electronic device 200. The housing 202 has an opening 204 that allows audio sound to enter or be emitted from the portable electronic device 200. The portable electronic device 200 includes an audio element 206 provided internal to the housing 202 for the portable electronic device 200. The audio element 206 can represent a speaker driver (e.g., speaker) and/or a receiver (e.g., microphone). When the audio element 206 serves as a receiver, audio sound can be picked-up via the opening 204 in the housing 202. The sound, in this example, can be environment or can be audio sound (e.g., voice communications) associated with a user.

Alternatively, when the audio element 206 serves as a speaker driver, the speaker driver 306 upon controlled activation can produce audio sound that can be directed out of the opening 204 of the housing 202. For example, the audio sound can be associated with playback of digital media asset, such as a video file (e.g., movie), an audio file (e.g., music or podcast), etc., by the portable electronic device 300. As another example, the audio sound can be associated with a user, such as a voice conversation, using the portable electronic device 200 as a wireless telephone.

In the low-profile design for the portable electronic device 200, the compactness of the portable electronic device 200 is of importance. Consequently, placement of the audio element 206 within the housing 202 for the portable electronic device 200 is managed such that the overall size and/or thickness of the portable electronic device 200 is able to remain compact (e.g., thin).

As shown in FIG. 2A, an audio channel can be established between the speaker driver 206 and the opening 204. The audio element 206 can be acoustically coupled to the opening 204 in the housing 202 by or via various components that participate in providing the audio channel. In the embodiment illustrated in FIG. 2A, the audio channel can extend from the speaker driver 206 to the opening 204 in the housing 202. As such, the audio channel passes through an opening 208 within a flexible electronic substrate 210. The flexible electrical substrate 210 is, for example, a flex circuit. The flexible electrical substrate 210 can provide electrical traces, pads, vias, and the like that support electronic devices and/or electrical interconnections between electronic devices. The portable electronic device 200 can include a printed circuit board (PCB) (not shown) and the flexible electronic substrate 210 can couple to the PCB. The audio element 206 can be coupled to the flexible electrical substrate 210 such that audio element 206 (e.g., the receiver or speaker driver) is acoustically coupled to audio channel. In one implementation, the audio element 206 can be acoustically sealed to a first surface of the flexible electrical substrate 210 by a seal 212. The seal 212 can, for example, by provided by a layer of adhesive, a compliant gasket (e.g., form gasket), or solder. In the case where a gasket is used, an adhesive can be used to adhere the seal 212 to the first surface of the flexible electrical substrate 210 as well as to the audio element 206.

To further support the audio channel, the portable electronic device 200 can also include an audio chamber 214 (or audio boot). The audio chamber 214 can include a first portion 214a and a second portion 214b. In one implementation, the first portion 214a is a substantially rigid member, and the second portion 214b is a substantially compliant member. The rigidity of the first portion 214a and the compliance of the second portion 312b are relative to one another. The audio chamber 214 is normally a single structure and can be formed with a molding process with respect to elastomers (e.g., plastics (including thermoplastics elastomers), rubber or foams), such as nylon, silicone, Acrylonitrile Butadiene Styrene (ABS), or polypropylene. For example, a co-molding or overmolding process can be performed to integrally form the audio chamber 214 having the first portion 214a and the second portion 214b.

The first portion 214a can be adhered to a second surface of the flexible electronic substrate 210. For example, an adhesive layer 216 can be provided between the second surface of the flexible electrical substrate 210 and the first portion 214a of the audio chamber 214. The second portion 214b can be provided adjacent the opening 204 in the housing 202. In one implementation, the second portion 214b can abut against the opening 204 in the housing 202. The second portion 214b can be secured and/or acoustically sealed about the opening 204 by any of a variety of ways, including by the second portion 214b itself, a gasket, adhesive and the like, or some combination thereof.

The audio chamber 214 includes an audio channel 216 that extends through the audio chamber 214. Hence, the audio channel 216 provided by the audio chamber 214 serves to extend the audio channel from the flexible electronic substrate 210 to the opening 204 in the housing 202. As such, the opening 208 in the flexible electrical substrate 210 and the audio channel 216 through the audio chamber 214 both facilitate providing the complete audio channel. The audio element 206 can emit or receive sound through the opening 208 in the flexible electrical substrate 210 and through the audio channel 216 of the audio chamber 214 so that the sound being emitted or received by the audio element 206 can pass through the opening 204 in the housing 202.

Additionally, a mesh barrier 218 (or mesh screen) can be included with the audio chamber 214. More particularly, the mesh barrier 218 can be provided in the audio channel 216 of the audio chamber 214 to block unwanted substances from further entering the audio channel. The mesh barrier 218 serves as a device that does not substantially impede audio sound through the audio channel 216, but does provide a barrier that impedes foreign substances (e.g., dust, dirt) from passing through the audio channel 216. In one embodiment, the mesh barrier is molded along with the molding of the second portion 214b. By molding the mesh barrier, which tends to be quite small, with the audio chamber 214, assembly of an audio subsystem for the portable electronic device becomes simplified and more reliable.

In general, the position of the mesh barrier 218 can be adjacent or within the audio channel 216. FIG. 2A illustrates the mesh barrier 218 within the audio channel 216 proximate to the opening 204 of the housing 202, which is the environmental opening of the audio channel. However, in other embodiments, the mesh barrier 218 can be positioned differently.

Figure 2B:
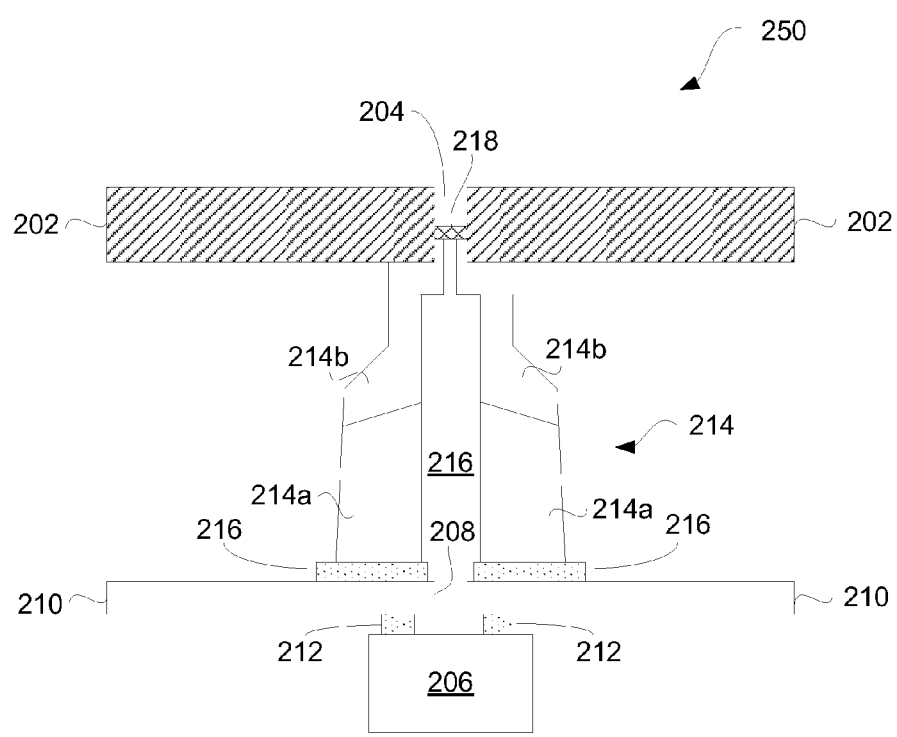
FIG. 2B is a partial cross-sectional diagram of a portable electronic device 250 according to one embodiment.

FIG. 2B is a partial cross-sectional diagram of a portable electronic device 250 according to one embodiment. The portable electronic device 250 is generally similar to the portable electronic device 200 illustrated in FIG. 2A. However, the portable electronic device 250 positions the mesh barrier 218 at the top portion of the second portion 214b. Again, the mesh barrier 218 can be molded integrally with the second portion 214b.

Figure 3A:
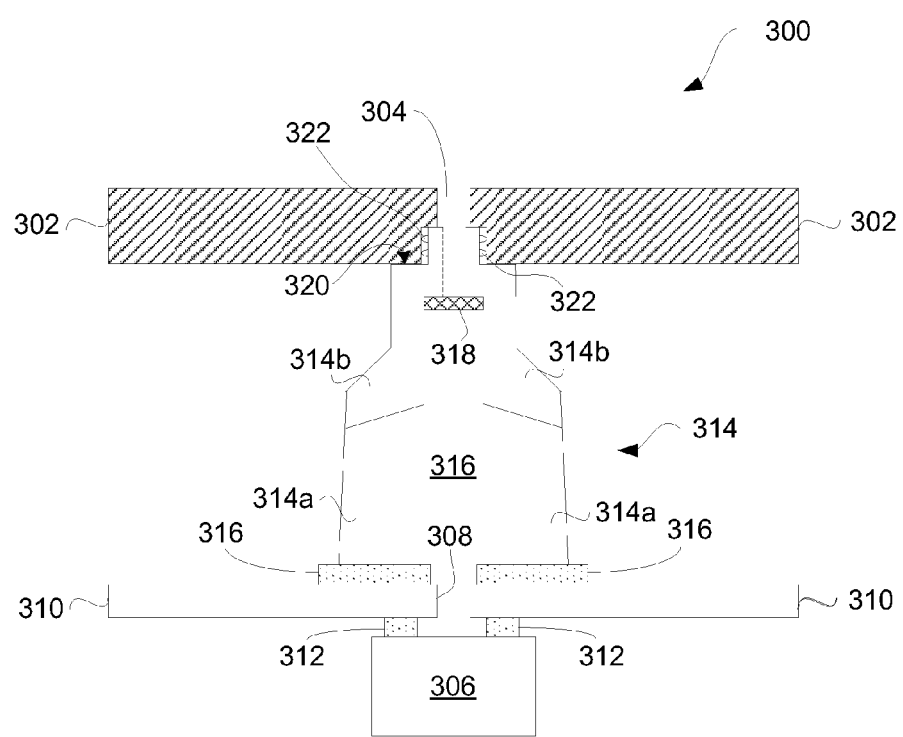
FIG. 3A is a partial cross-sectional diagram of a portable electronic device 300 according to one embodiment.

FIG. 3A is a partial cross-sectional diagram of a portable electronic device 300 according to one embodiment. In general, the portable electronic device 300 is similar to the portable electronic device 200 illustrated in FIG. 2A except that sealing to a housing is performed differently and position of mesh barrier is slightly repositioned.

The portable electronic device 300 includes a housing 302 for the portable electronic device 300. The housing 302 has an opening 304 that allows audio sound to enter or be emitted from the portable electronic device 300. The portable electronic device 300 includes an audio element 306 provided internal to the housing 302 for the portable electronic device 300. The audio element 306 can represent a speaker driver (e.g., speaker) and/or a receiver (e.g., microphone). When the audio element 306 serves as a receiver, audio sound can be picked-up via the opening 304 in the housing 302. The sound, in this example, can be environment or can be audio sound (e.g., voice communications) associated with a user.

Alternatively, when the audio element 306 serves as a speaker driver, the speaker driver 306 upon controlled activation can produce audio sound that can be directed out of the opening 304 of the housing 302. For example, the audio sound can be associated with playback of digital media asset, such as a video file (e.g., movie), an audio file (e.g., music or podcast), etc., by the portable electronic device 300. As another example, the audio sound can be associated with a user, such as a voice conversation, using the portable electronic device 300 as a wireless telephone.

In the low-profile design for the portable electronic device 300, the compactness of the portable electronic device 300 is of importance. Consequently, placement of the audio element 306 within the housing 302 for the portable electronic device 300 is managed such that the overall size and/or thickness of the portable electronic device 300 is able to remain compact (e.g., thin).

As shown in FIG. 3A, an audio channel can be established between the speaker driver 306 and the opening 304. The audio element 306 can be acoustically coupled to the opening 304 in the housing 302 by or via various components that participate in providing the audio channel. In the embodiment illustrated in FIG. 3A, the audio channel can extend from the speaker driver 306 to the opening 304 in the housing 302. As such, the audio channel passes through an opening 308 within a flexible electronic substrate 310. The flexible electrical substrate 310 is, for example, a flex circuit. The flexible electrical substrate 310 can provide electrical traces, pads, vias, and the like that support electronic devices and/or electrical interconnections between electronic devices. The portable electronic device 300 can include a printed circuit board (PCB) (not shown) and the flexible electronic substrate 310 can couple to the PCB. The audio element 306 can be coupled to the flexible electrical substrate 310 such that audio element 306 (e.g., the receiver or speaker driver) is acoustically coupled to audio channel. In one implementation, the audio element 306 can be acoustically sealed to a first surface of the flexible electrical substrate 310 by a seal 312. The seal 312 can, for example, by provided by a layer of adhesive, a compliant gasket (e.g., form gasket), or solder. In the case where a gasket is used, an adhesive can be used to adhere the seal 312 to the first surface of the flexible electrical substrate 310 as well as to the audio element 306.

To further support the audio channel, the portable electronic device 300 can also include an audio chamber 314 (or audio boot). The audio chamber 314 can include a first portion 314a and a second portion 314b. In one implementation, the first portion 314a is a substantially rigid member, and the second portion 314b is a substantially compliant member. The rigidity of the first portion 314a and the compliance of the second portion 312b are relative to one another. The audio chamber 314 is normally a single structure and can be formed with a molding process with respect to elastomers (e.g., plastics (including thermoplastics elastomers), rubber or foams), such as nylon, silicone, Acrylonitrile Butadiene Styrene (ABS), or polypropylene. For example, a co-molding or overmolding process can be performed to integrally form the audio chamber 314 having the first portion 314a and the second portion 314b.

The first portion 314a can be adhered to a second surface of the flexible electronic substrate 310. For example, an adhesive layer 316 can be provided between the second surface of the flexible electrical substrate 310 and the first portion 314a of the audio chamber 314. The second portion 314b can be provided adjacent the opening 304 in the housing 302.

The audio chamber 314 includes an audio channel 316 that extends through the audio chamber 314. Hence, the audio channel 316 provided by the audio chamber 314 serves to extend the audio channel from the flexible electronic substrate 310 to the opening 304 in the housing 302. As such, the opening 308 in the flexible electrical substrate 310 and the audio channel 316 through the audio chamber 314 both facilitate providing the complete audio channel. The audio element 306 can emit or receive sound through the opening 308 in the flexible electrical substrate 310 and through the audio channel 316 of the audio chamber 314 so that the sound being emitted or received by the audio element 306 can pass through the opening 304 in the housing 302.

Additionally, a mesh barrier 318 (or mesh screen) can be included with the audio chamber 314. More particularly, the mesh barrier 318 can be provided in the audio channel 316 of the audio chamber 314 to block unwanted substances from further entering the audio channel. The mesh barrier 318 serves as a device that does not substantially impede audio sound through the audio channel 316, but does provide a barrier that impedes foreign substances (e.g., dust, dirt) from passing through the audio channel 316. In one embodiment, the mesh barrier is molded along with the molding of the second portion 314b. By molding the mesh barrier, which tends to be quite small, with the audio chamber 314, assembly of an audio subsystem for the portable electronic device becomes simplified and more reliable.

In general, the position of the mesh barrier 318 can be adjacent or within the audio channel 316. FIG. 3A illustrates the mesh barrier 318 within the audio channel 316 proximate to the opening 304 of the housing 302, which is the environmental opening of the audio channel. However, in other embodiments, the mesh barrier 318 can be positioned differently.

In one embodiment, such as shown in FIG. 3A, the second portion 314b can abut against the opening 304 in the housing 302. The second portion 314b can be secured and/or acoustically sealed about the opening 304. In addition, to assist with acoustically sealing the acoustic chamber 310 to the housing 302 can include a recess 320, and the top portion of the second portion 314b can be integrally provided with one or more sealing rings 322. For example, the sealing rings 322 can be molded with the second portion 314b. The sealing rings 322 of the acoustic chamber fit against and seal to the recess 320 in the housing 302.

Figure 3B:
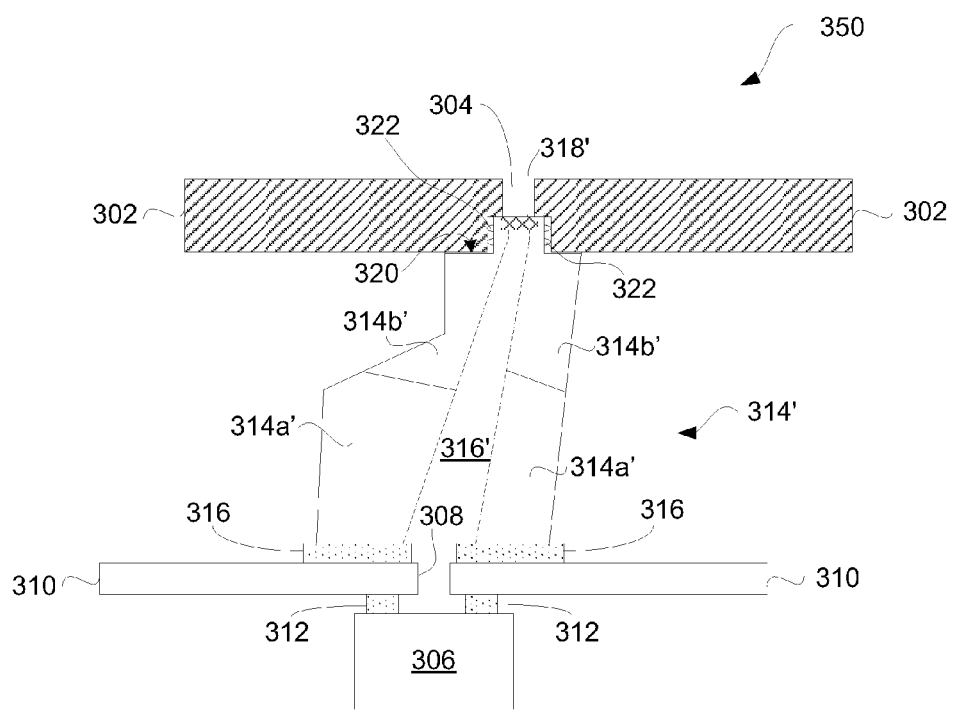
FIG. 3B is a partial cross-sectional diagram of a portable electronic device 350 according to one embodiment.

FIG. 3B is a partial cross-sectional diagram of a portable electronic device 350 according to one embodiment. The portable electronic device 350 is generally similar to the portable electronic device 300 illustrated in FIG. 3A. However, with the portable electronic device 350, the acoustic chamber 310' is provided in an angular manner to compensate for a position offset between the opening 304 in the housing 302 and the opening 308 in the flexible electrical substrate 310. Hence, the acoustic chamber 310' can be formed to translate its audio channel 316' in up to three-dimensions. The audio channel 316' can also be narrowed or tapered from one end to the other. Additionally, the mesh barrier 318' can be position at the top of the second portion 314b'.

Figure 4A:
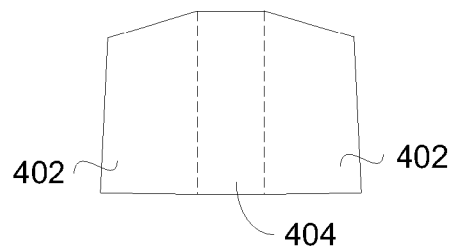
FIGS. 4A-4C is a cross-sectional diagrams of formation of an acoustic chamber 400 according to one embodiment.
Figure 4B:
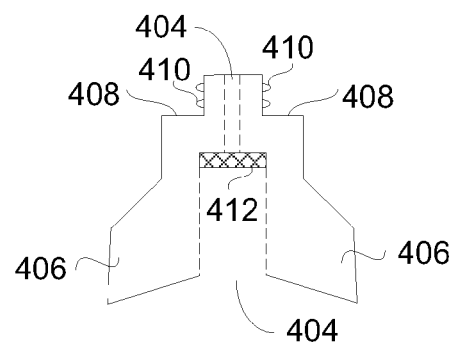
Figure 4C:
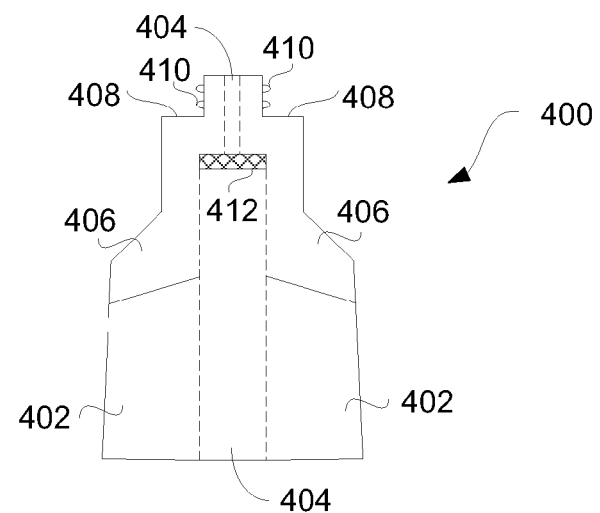

FIGS. 4A-4C is a cross-sectional diagrams of formation of an acoustic chamber 400 according to one embodiment. FIG. 4A illustrates a first portion 402 of the acoustic chamber 400. The first portion 402 has an internal audio channel 404. The first portion 402 is can be molded using a relatively rigid elastomer, such as polycarbonate or Acrylonitrile Butaduene Styrene (ABS). FIG. 4B illustrates a second portion 406 of the acoustic chamber 402. The second portion 406 also has the internal audio channel 404 that extends through the second portion 406. The first portion 402 is can be molded using a relatively compliant elastomer, such as silicone. The top portion of the second portion 406 has a recess 408. Sealing rings 410 are formed at the recess 408. In one embodiment, the sealing rings 410 are molded along with the molding of the second portion 402. In addition, the second portion 406 includes a mesh barrier 412. The mesh barrier 412 serves as a device that does not substantially impede audio sound through the audio channel 404, but does provide a barrier that impedes foreign substances (e.g., dust, dirt) from passing through the audio channel 404. In one embodiment, the mesh barrier 412 is molded along with the molding of the second portion 402.

FIG. 4C illustrated the acoustic chamber 400 formed from the first portion 402 shown in FIG. 4A and the second portion 406 shown in FIG. 4B. In one embodiment, the acoustic chamber 400 is formed by a two-shot molding process. In a first-shot of molding, the first portion 402 is molded in a mold using a first material that is a relatively rigid elastomer. Then, in a second shot of molding, the mold is reconfigured and the second portion 406 is thereafter molded onto the first portion 402 (which remains in the mold) using a second material that is relatively conformable elastomer. As such, the second portion 406 is integrally molded, and thus bonded, to the first portion 402.

Figure 5:
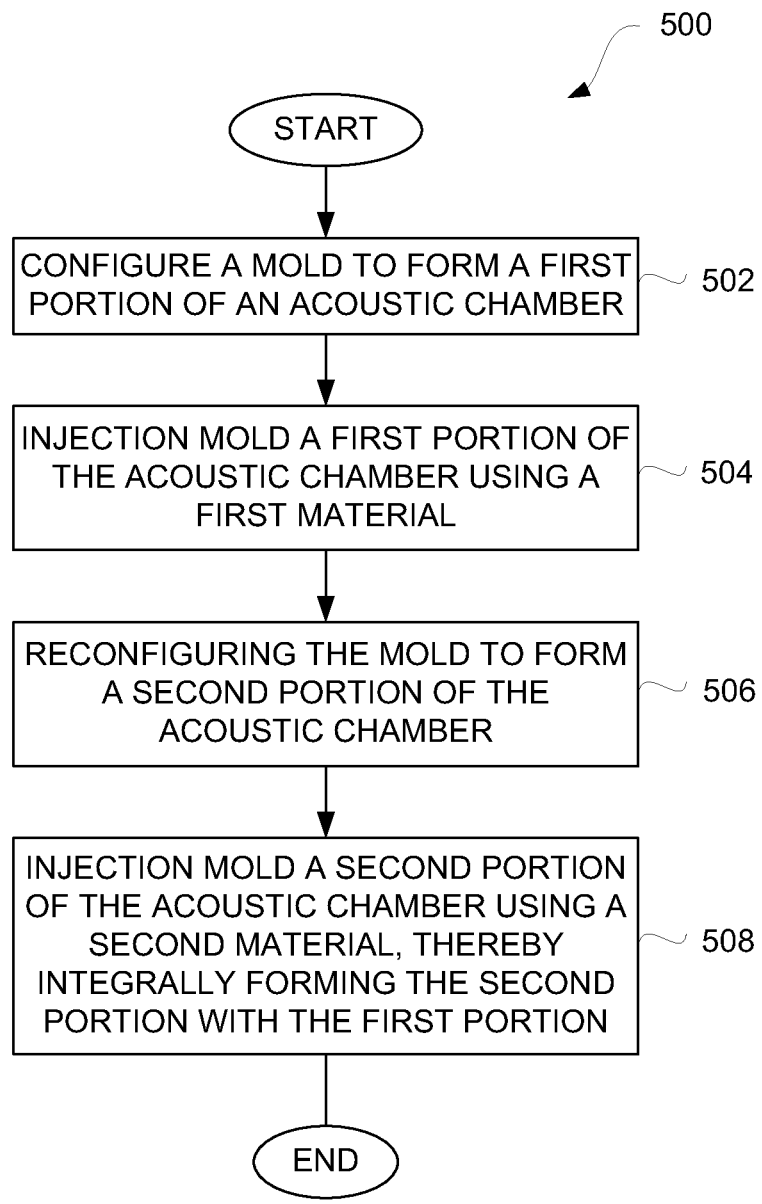
FIG. 5 is a flow diagram of an acoustic chamber molding process according to one embodiment.

FIG. 5 is a flow diagram of an acoustic chamber molding process 500 according to one embodiment. The acoustic chamber molding process 500 can initially configure 502 a mold to form a first portion of an acoustic chamber. Once the mold has been configured 502, the first portion of the acoustic chamber can be injection molded 504 using a first material. Next, the mold can be reconfigured 506 to form a second portion of the acoustic chamber. After the mold has been reconfigured 506, the second portion of the acoustic chamber can be injection molded 508 using a second material. The second material can be more compliant, i.e., less rigid, than the first material. Here, the second portion is integrally formed with the first portion. After the second portion has been injection molded 508 such that it is integrally formed with the first portion, the acoustic chamber molding process 500 can end.

Figure 6:
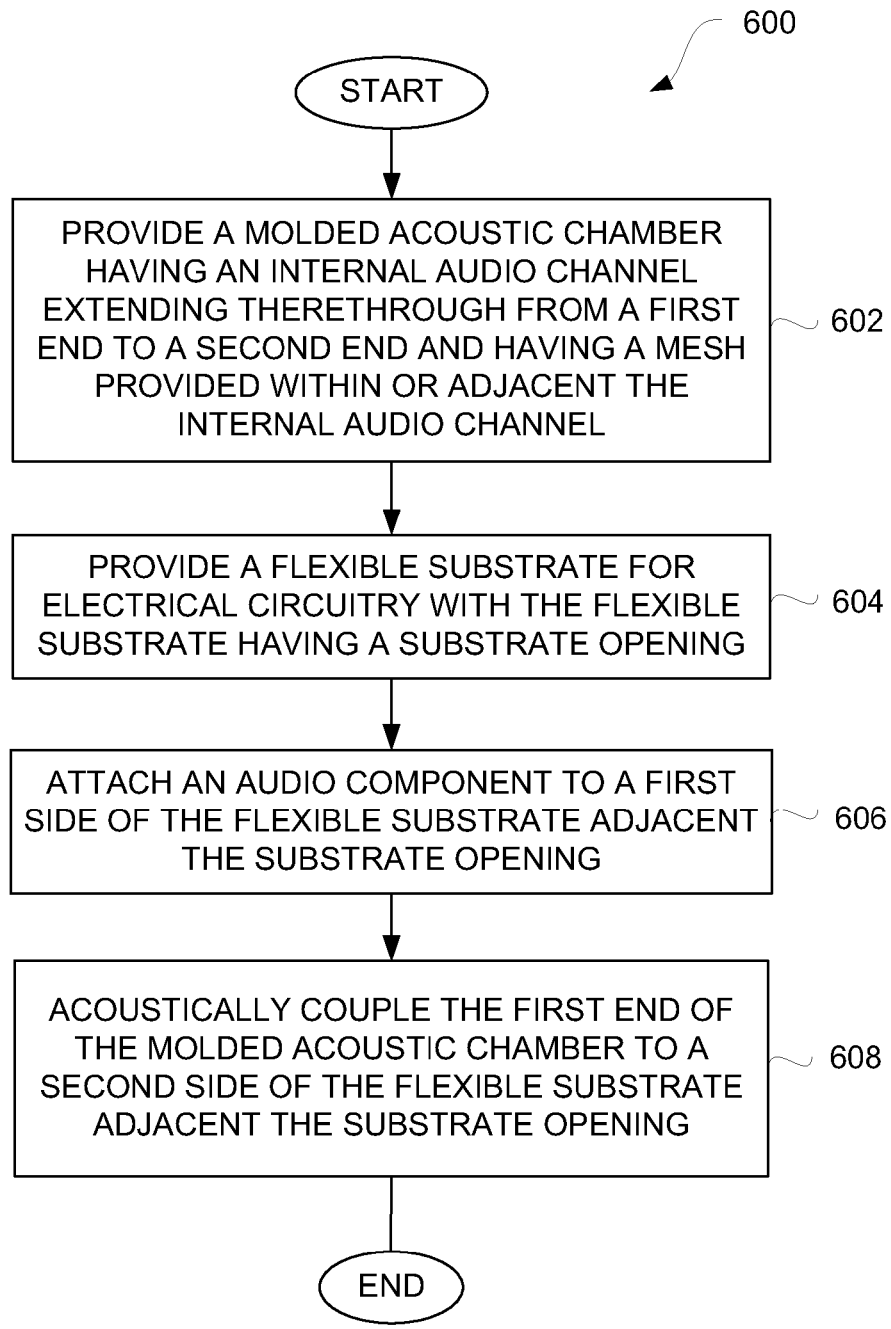
FIG. 6 is a flow diagram of an acoustic chamber assembly process according to one embodiment.

FIG. 6 is a flow diagram of an acoustic chamber assembly process 600 according to one embodiment. The acoustic chamber assembly process 600 can provide 602 a molded acoustic chamber having an internal audio channel. The molded acoustic chamber can extend through the molded acoustic chamber from a first end to a second end. The molded acoustic chamber can also include a mesh provided within or adjacent the internal audio channel. The acoustic chamber assembly process 600 can also provide 604 a flexible substrate for electrical circuitry with the flexible substrate having a substrate opening. In addition, an audio component can be attached 606 to a first side of the flexible substrate adjacent the substrate opening. Further, the acoustic chamber assembly process 600 can acoustically couple 608 the first end of the molded acoustic chamber to a second side of the flexible substrate adjacent the substrate opening. After the first end of the molded acoustic chamber is acoustically couple 608 to the second side of the flexible substrate, the acoustic chamber assembly process 600 has assembled the acoustic chamber and can end.

Figures 7A, 7B:
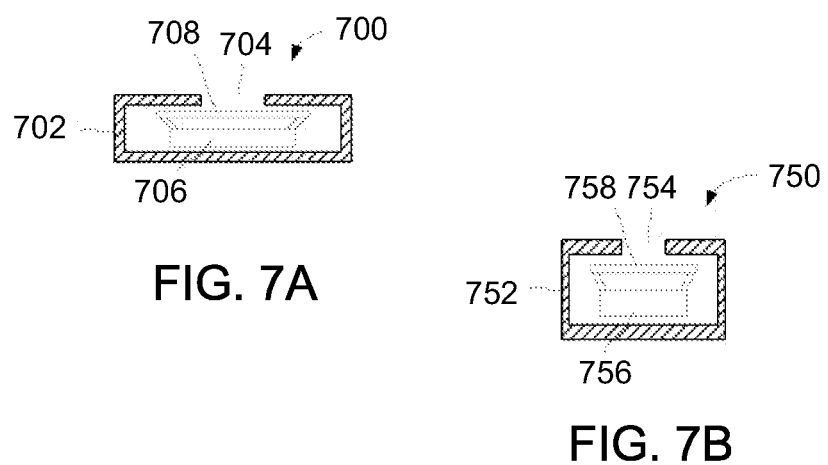
FIG. 7A is a cross-sectional view of a speaker driver according to one embodiment.
FIG. 7B is a cross-sectional view of a receiver according to one embodiment.

FIG. 7A is a cross-sectional view of a speaker driver 700 according to one embodiment. The speaker driver 700 can pertain to the audio element (operating as a speaker driver) 206, 306 in FIGS. 2A, 2B, 3A and 3B. The speaker driver 700 can pertain to a dynamic speaker. The speaker driver 700 includes a speaker housing 702. The speaker housing 702 has an opening 704 through which generated sound wave can be expelled from the opening 704. The internal structure of the speaker driver 700 can include a driver element 706 (e.g., magnet and coil) and a diaphragm 708.

Although the speaker driver 700 includes a speaker housing 702, it should be noted that in another embodiment, the speaker driver 700 can be mounted internal to an electronic device housing without a dedicated speaker housing, i.e., without the speaker housing 702. In one implementation, the driver element 706 (e.g., magnet and coil) and the diaphragm 708 can be secured to a structure within the electronic device housing (without a dedicated speaker housing).

FIG. 7B is a cross-sectional view of a receiver 750 according to one embodiment. The receiver 750 can pertain to the audio element (operating as a microphone) 206, 306 in FIGS. 2A, 2B, 3A and 3B. The receiver 750 can pertain to a MEMS microphone. The receiver 750 includes a receiver housing 752. The receiver housing 752 has an opening 754 through which generated sound wave can be expelled from the opening 754. The internal structure of the receiver 750 can include a receiver element 756 (e.g., magnet and coil) and a diaphragm 758.

Although the receiver 750 includes a receiver housing 752, it should be noted that in another embodiment, the receiver 750 can be mounted internal to an electronic device housing without a dedicated receiver housing, i.e., without the receiver housing 752. In one implementation, the receiver element 756 (e.g., magnet and coil) and the diaphragm 758 can be secured to the electronic device housing (without a dedicated receiver housing).

In one embodiment, the scale of a portable device housing and the opening in the housing for an audio port are rather small. For example, the thickness of the housing can be approximately 3 millimeters (mm) or less, and the opening in the housing for the audio port can be approximately 1 mm in diameter or less.

Figure 8:
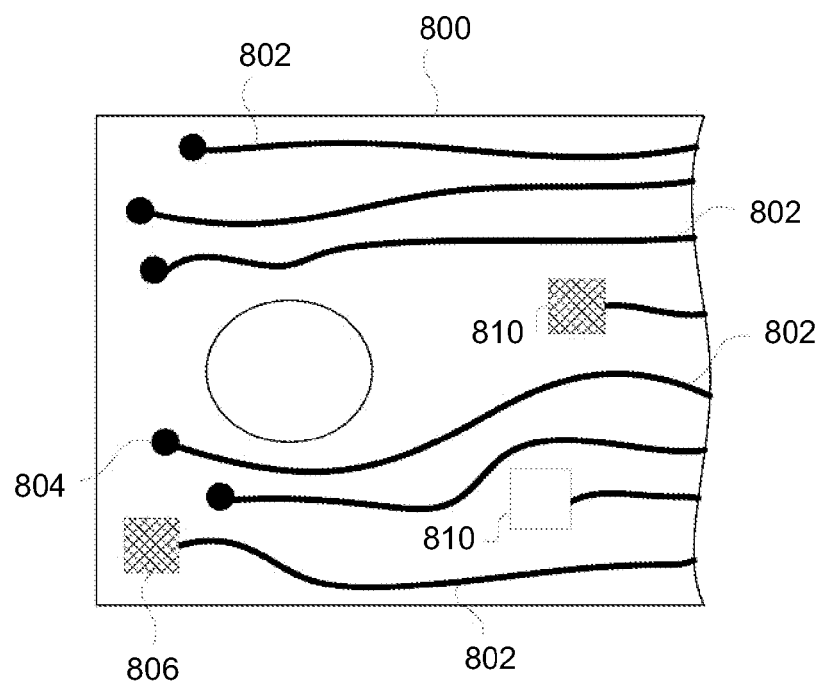
FIG. 8 is a top view of a portion of a flexible substrate according to one embodiment.

FIG. 8 is a top view of a portion of a flexible substrate 800 according to one embodiment. The flexible substrate 800 can, for example, be a flex circuit. The flexible substrate 800 can provide electrical traces 802, electrical connections 804 and/or electrical pads 806 on one or both primary surfaces of the flexible substrate 800. The flexible substrate 800 can also include an opening 808 there through for supporting an audio port as discussed above where an audio component (e.g., receiver or speaker driver) can be coupled to the flexible substrate 800 over or adjacent the opening 808.

Further, various electronic components can be attached to the flexible substrate 800. These electrical components can include transistors, capacitors, resistors, inductors, integrated circuits, microphones, sensors, switches, etc. For example, the flexible substrate 800 can include a representative electrical component 810 electrically and mechanically attached to the flexible substrate 800.

Another aspect of certain embodiments provides a low-profile audio port arrangement. The audio port arrangement can include an acoustic chamber that include at least one recess area for a barrier that can block foreign matter from an audio channel while not blocking the audio sound from passing through the acoustic chamber.

Figure 9:
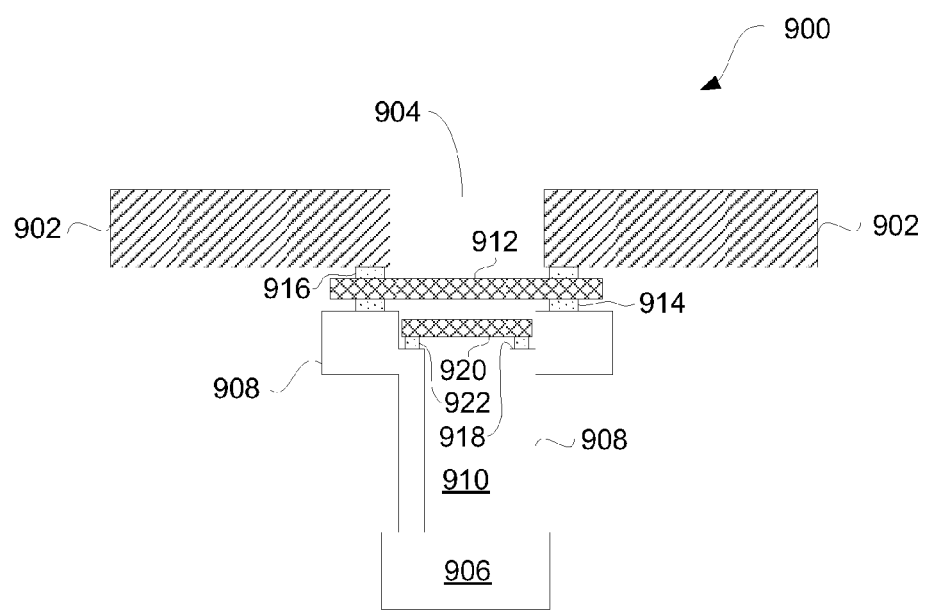
FIG. 9 is a partial cross-sectional diagram of a portable electronic device according to one embodiment.

FIG. 9 is a partial cross-sectional diagram of a portable electronic device 900 according to one embodiment. The portable electronic device 900 includes a housing 902 for the portable electronic device 900. The housing 902 has an opening 904 that allows audio sound to enter or be emitted from the portable electronic device 900. The portable electronic device 900 includes an audio element 906 provided internal to the housing 902 for the portable electronic device 900. The audio element 906 can represent a speaker driver (e.g., speaker) and/or a receiver (e.g., microphone).

When the audio element 906 serves as a receiver, audio sound can be picked-up via the opening 904 in the housing 902. The sound, in this example, can be environment or can be audio sound (e.g., voice communications) associated with a user.

Alternatively, when the audio element 906 serves as a speaker driver, the speaker driver 906 upon controlled activation can produce audio sound that can be directed out of the opening 904 of the housing 902. For example, the audio sound can be associated with playback of digital media asset, such as a video file (e.g., movie), an audio file (e.g., music or podcast), etc., by the portable electronic device 900. As another example, the audio sound can be associated with a user, such as a voice conversation, using the portable electronic device 900 as a wireless telephone.

In the low-profile design for the portable electronic device 900, the compactness of the portable electronic device 900 is of importance. Consequently, placement of the audio element 906 within the housing 902 for the portable electronic device 900 is managed such that the overall size and/or thickness of the portable electronic device 900 is able to remain compact (e.g., thin).

As shown in FIG. 9, an audio channel can be established between the audio element 906 and the opening 904. The audio element 906 can be acoustically coupled to the opening 904 in the housing 902 by or via various components that participate in providing the audio channel. In the embodiment illustrated in FIG. 9, the audio channel can extend from the audio element 906 to the opening 904 in the housing 902.

To further support the audio channel, the portable electronic device 900 can include an acoustic chamber 908 (or audio boot). The acoustic chamber 908 can include an internal audio channel 910 that extends through the acoustic chamber 908 from a first end to a second end. The acoustic chamber 908 is normally a single structure and can be formed with a molding process with respect to elastomers (e.g., plastics (including thermoplastics elastomers), rubber or foams), such as nylon, silicone, Acrylonitrile Butadiene Styrene (ABS), or polypropylene.

The first end of the acoustic chamber 908 can abut against the audio element 906. The first end of the acoustic chamber 908 can be secured and/or acoustically sealed to the audio element 906 by any of a variety of ways, including a mechanical feature, a gasket, adhesive and the like, or some combination thereof. The second end of the acoustic chamber 908 can be acoustically coupled to a cosmetic barrier 912 (e.g., cosmetic mesh barrier). An adhesive layer 914 can be provided to couple the second end of the acoustic chamber 908 to a first side of the cosmetic barrier 912. A second side of the cosmetic barrier 912 can be acoustically coupled to the housing 902 around the opening 904 in the housing 902. An adhesive layer 916 can be provided to couple a second side of the cosmetic barrier 912 to the inner surface of the housing 902.

The acoustic chamber 900 also includes a recess 918. An acoustic barrier 920 (acoustic mesh barrier) can be provided and secured in the recess 918. The acoustic barrier 920 can be provided in the audio channel 910 of the acoustic chamber 908 to block unwanted substances from further entering the audio channel. The acoustic barrier 920 serves as a device that does not substantially impede audio sound through the audio channel 910, but does provide a barrier that impedes foreign substances (e.g., dust, dirt) from passing through the audio channel 910. In one embodiment, the acoustic barrier 920 can be a separate component that is secured to the recess 918 of the acoustic chamber 908. In another embodiment, the acoustic barrier 920 can be integrally formed (e.g., molded) along with the molding of the acoustic chamber 908.

The acoustic barrier 920 can be secured and/or acoustically sealed to the recess 918 by any of a variety of ways, including a mechanical feature, a gasket, adhesive and the like, or some combination thereof. In one embodiment, as shown in FIG. 9, an adhesive layer 922 can be provided to couple the acoustic barrier 920 to the recess 918 in the acoustic chamber 900.

Since the acoustic barrier 920 is provided in the recess 918 and surrounded by the acoustic seal provided for the cosmetic barrier 912 (e.g., via the adhesive layer 914), in one embodiment, the acoustic barrier 920 can be secured to the recess 918 without being acoustically sealed. Also, by providing the acoustic barrier 920 at the recess 918 of the acoustic chamber 908, the acoustic barrier 920 can provide a more compact and reliable design. That is, since the acoustic barrier 920 is not in an audio channel stack-up, its height can be partially or fully hidden. Further, since acoustically sealing against an acoustic barrier, which tends to be small and pliable, is difficult, providing the acoustic barrier 920 within the recess 918 mitigates its acoustic sealing from impacting design reliability.

Figure 10:
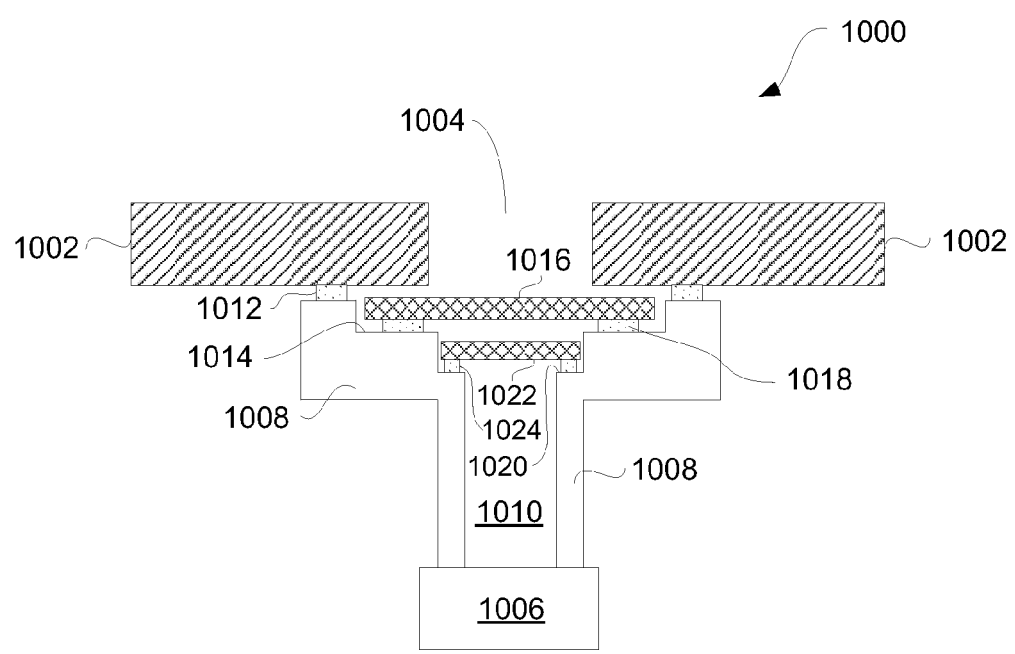
FIG. 10 is a partial cross-sectional diagram of a portable electronic device according to one embodiment.

FIG. 10 is a partial cross-sectional diagram of a portable electronic device 1000 according to one embodiment. The portable electronic device 1000 shown in FIG. 10 is similar to the portable electronic device 900 illustrated in FIG. 9, except that the portable electronic device 1000 provides two recessed regions.

The portable electronic device 1000 includes a housing 1002 for the portable electronic device 1000. The housing 1002 has an opening 1004 that allows audio sound to enter or be emitted from the portable electronic device 1000. The portable electronic device 1000 includes an audio element 1006 provided internal to the housing 1002 for the portable electronic device 1000. The audio element 1006 can represent a speaker driver (e.g., speaker) and/or a receiver (e.g., microphone).

When the audio element 1006 serves as a receiver, audio sound can be picked-up via the opening 1004 in the housing 1002. The sound, in this example, can be environment or can be audio sound (e.g., voice communications) associated with a user.

Alternatively, when the audio element 1006 serves as a speaker driver, the speaker driver 1006 upon controlled activation can produce audio sound that can be directed out of the opening 1004 of the housing 1002. For example, the audio sound can be associated with playback of digital media asset, such as a video file (e.g., movie), an audio file (e.g., music or podcast), etc., by the portable electronic device 1000. As another example, the audio sound can be associated with a user, such as a voice conversation, using the portable electronic device 1000 as a wireless telephone.

In the low-profile design for the portable electronic device 1000, the compactness of the portable electronic device 1000 is of importance. Consequently, placement of the audio element 1006 within the housing 1002 for the portable electronic device 1000 is managed such that the overall size and/or thickness of the portable electronic device 1000 is able to remain compact (e.g., thin).

As shown in FIG. 10, an audio channel can be established between the audio element 1006 and the opening 1004. The audio element 1006 can be acoustically coupled to the opening 1004 in the housing 1002 by or via one or more components that participate in providing the audio channel. In the embodiment illustrated in FIG. 10, the audio channel can extend from the audio element 1006 to the opening 1004 in the housing 1002. To support the audio channel, the portable electronic device 1000 can include an acoustic chamber 1008 (or audio boot). The acoustic chamber 1008 can include an internal audio channel 1010 that extends through the acoustic chamber 1008 from a first end to a second end. The acoustic chamber 1008 is normally a single structure and can be formed with a molding process with respect to elastomers (e.g., plastics (including thermoplastics elastomers), rubber or foams), such as nylon, silicone, Acrylonitrile Butadiene Styrene (ABS), or polypropylene.

The first end of the acoustic chamber 1008 can abut against the audio element 1006. The first end of the acoustic chamber 1008 can be secured and/or acoustically sealed to the audio element 1006 by any of a variety of ways, including a mechanical feature, a gasket, adhesive and the like, or some combination thereof. The second end of the acoustic chamber 1008 can be acoustically coupled to the housing 1002 around the opening 1004 in the housing 1002. An adhesive layer 1012 can be provided to couple a second side of the acoustic chamber 1008 to the inner surface of the housing 1002.

The acoustic chamber 1010 can include a first recess 1014. A cosmetic barrier 1016 (e.g., cosmetic mesh barrier) can be provided and secured in the first recess 1014. The cosmetic barrier 1016 can be provided for aesthetic reasons but may also serve to block some unwanted substances from the audio channel 1010. For example, the cosmetic barrier 1016 can be a metal mesh. An adhesive layer 1018 can be provided at the first recess 1014 to secure (and possibly acoustically seal) the cosmetic barrier 1016 to the first recess 1014.

The acoustic chamber 1000 can also includes a second recess 1020. An acoustic barrier 1022 (acoustic mesh barrier) can be provided and secured in the recess 1020. The acoustic barrier 1022 can be provided in the audio channel 1010 of the audio chamber 1008 to block unwanted substances from further entering the audio channel. The acoustic barrier 1022 can serve as a device that does not substantially impede audio sound through the audio channel 1010, but does provide a barrier that impedes foreign substances (e.g., dust, dirt) from passing through the audio channel 1010. In one embodiment, the acoustic barrier 1022 can be a separate component that is secured to the second recess 1020 of the acoustic chamber 1008. In another embodiment, the acoustic barrier 1022 can be integrally formed (e.g., molded) along with the molding of the acoustic chamber 1008.

The acoustic barrier 1022 can be secured and/or acoustically sealed to the second recess 1020 by any of a variety of ways, including a mechanical feature, a gasket, adhesive and the like, or some combination thereof. In one embodiment, as shown in FIG. 10, an adhesive layer 1024 can be provided to couple the acoustic barrier 1022 to the recess 1020 in the acoustic chamber 1010.

Since the cosmetic barrier 1016 is provided in the first recess 1014 and the acoustic barrier 1022 is provided in the second recess 1020, these barriers need not provide acoustic seals. Since these barriers 1016 and 1022 are surrounded by the acoustic seal provided for the second end of the acoustic chamber 1008 (e.g., via the adhesive layer 1012), in one embodiment, the cosmetic barrier 1016 can be secured to the first recess 1014 without being acoustically sealed and also the acoustic barrier 1022 can be secured to the second recess 1020 without being acoustically sealed. Also, by providing the cosmetic barrier 1016 at the first recess 1014 and the acoustic barrier 1022 at the second recess 1020, the audio channel for the audio element 1006 can provided with a more compact and reliable design. That is, neither the cosmetic barrier 1016 nor the acoustic barrier 1022 are in an audio channel stack-up, and thus their height can be partially or fully hidden. Further, since acoustically sealing against an acoustic barrier, which tends to be small and pliable, is difficult, providing the acoustic barrier 1022 within the second recess 1020 mitigates its acoustic sealing from impacting design reliability.

Still another aspect of certain embodiments provides vibration isolation in a portable electronic device. The portable electronic device can include a low-profile acoustic module and a digital gyroscope. For improved operation, a vibration isolation member can be provided to isolate potentially interfering vibrations from the audio module to the digital gyroscope.

Figure 11:
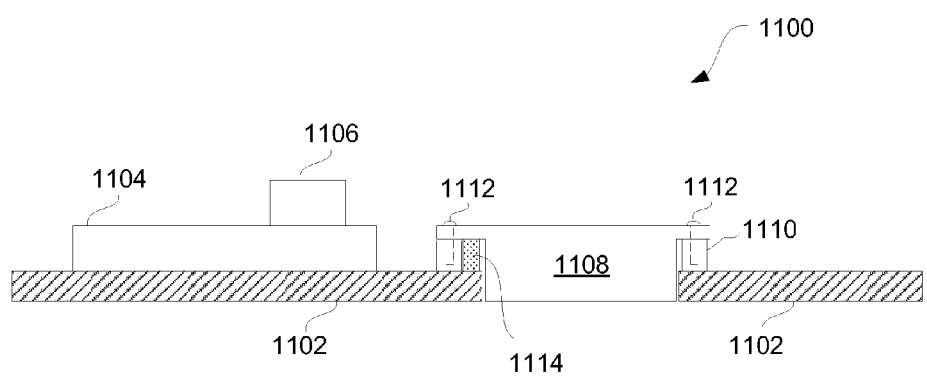
FIG. 11 is a partial cross-sectional diagram of a portable electronic device according to one embodiment.

FIG. 11 is a partial cross-sectional diagram of a portable electronic device 1100 according to one embodiment. The portable electronic device 1100 can include, in part, an internal frame 1102 that is provided internal to a housing for the portable electronic device 1100. Attached to the internal frame 1102 is a printed circuit substrate 1104 (e.g., printed circuit board). The printed circuit substrate 1104 can include electrical traces, electrical components (e.g., electronic devices), and integrated circuits. One electrical component included on the printed circuit substrate 1104 is a digital gyroscope 1106 (e.g., gyro detector). The digital gyroscope 1106 can provide angular information pertaining to orientation of the portable electronic device 1100. In one embodiment, the digital gyroscope 1106 can provide inertial sensing technology that detects and measures the angular rate of an object. One example of a MEMS-based gyroscope is ADXRS453 available from Analog Devices, though like devices are available from various suppliers.

In addition, the portable electronic device 1100 also include an acoustic module 1108. The acoustic module 1108 can provide at least audio output (e.g., by a speaker) for the portable electronic device. The acoustic module 1108 can be secured to the internal frame 1102 via mounts 1110 and screws 1112. At least one vibration isolation member 1114 can be provide to isolate vibrations from the acoustic module 1108. In one embodiment, the vibration isolation member 1114 can be provided between at least a portion of the acoustic module 1108 and the internal frame 1102. As shown in FIG. 11, the vibration isolation member 1114 can be under compression (i.e., in a compressed state) as it serves to maintain separation between the acoustic module 1108 and the corresponding mount 1110. As a result, the vibration isolation member 1114 can serve to dampen or mitigate vibrations from the acoustic module 1108 that propagate to the internal frame 1102. As a result, vibrations from the acoustic module 1108 are at least partially isolated from reaching the digital gyroscope 1106, such as via the internal frame 1102. Accordingly, the vibration isolation member 1114 can reduce vibrations from the acoustic module 1108 that reach and possibly undesirably influence the digital gyroscope 1106. In one embodiment, the vibration isolation member 1114 can be an elastomer.

According to another embodiment, a linear vibration motor can be configured to facilitate low profile implementations. With portable electronic devices low profile designs are often required. Hence, a low-profile linear vibration motor can facilitate availability of low-profile implementations for portable electronic devices.

Figure 12A:
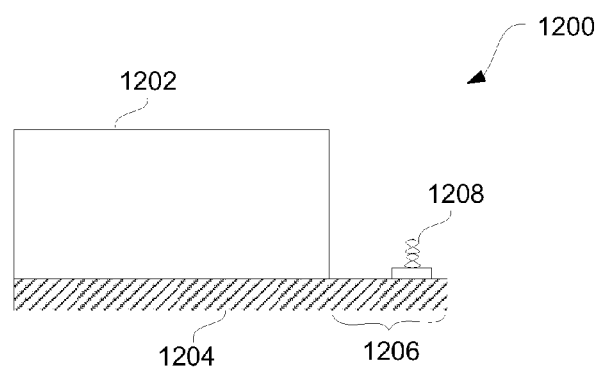
FIG. 12A illustrates a low-profile linear vibration motor according to one embodiment.

FIG. 12A illustrates a low-profile linear vibration motor 1200 according to one embodiment. The low-profile linear vibration motor 1200 has a reduced height, hence, its low profile. The low-profile linear vibration motor 1200 include a housing 1202 and an extended cover 1204. The extended cover 1204 can be integral with the housing 1202 or can be a separate component that attaches to the housing 1202. The extended cover 1204 has an extended side portion 1208 that contains one or more contact coils 1208 (contact springs). The low-profile linear vibration motor 1200 can be driven by an electromagnetic force with a resonance frequency determined using a spring provided within the low-profile linear vibration motor 1200 and a mass hanging from the spring to thereby generate vibrations.

Figure 12B:
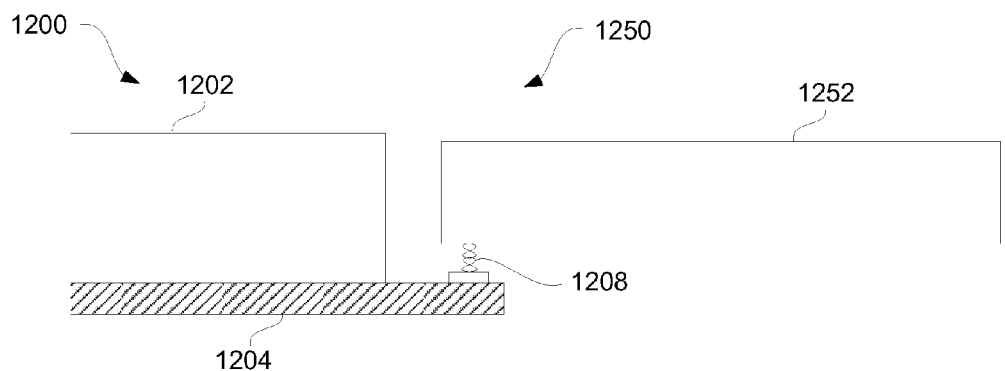
FIG. 12B illustrates a vibration motor assembly according to one embodiment.

FIG. 12B illustrates a vibration motor assembly 1250 according to one embodiment. The vibration motor assembly 1250 pertains to assembly of the low-profile linear vibration motor 1200 to a print circuit substrate 1252 (e.g., print circuit board. The low-profile linear vibration motor 1200 can be electrically connected to the printed circuit substrate 1252 by the one or more contact coils 1208. The printed circuit substrate 1252 can supply power to the low-profile linear vibration motor 1200 by way of the one or more contact coils 1208. The one or more contact coils 1208 can deform when the low-profile linear vibration motor 1200 is controlled to vibrate, such that resulting vibrations do not damage the electrical connections which are durable and reliable.

Conventionally, a low-profile linear vibration motor would include its contact coils on the bottom surface of its packaging and thus would then thus be used to attach to a printed circuit substrate. Advantageously, however, by providing the one or more contact coils 1208 to the side of the housing 1202 (such as the extended side portion 1208) enables the low-profile linear vibration motor 1200 to be coupled to the printed circuit substrate 1252 in a reduced profile manner (i.e., lower overall height).

Additional details on speaker arrangements can be found in: (1) U.S. patent application Ser. No. 12/794,561, filed Jun. 4, 2010 and entitled "AUDIO PORT CONFIGURATION FOR COMPACT ELECTRONIC DEVICES," which is hereby incorporated herein by reference; and (2) U.S. patent application Ser. No. 12/698,957, filed Feb. 2, 2010 and entitled "LOW-PROFILE SPEAKER ARRANGEMENTS FOR COMPACT ELECTRONIC DEVICES," which is hereby incorporated herein by reference.

Additional details on audio port configurations can be found in: (1) U.S. Provisional Application No. 61/325,803, filed Apr. 19, 2010 and entitled "AUDIO PORT CONFIGURATION FOR COMPACT ELECTRONIC DEVICES," which is hereby incorporated herein by reference; and (2) U.S. application Ser. No. 12/794,561, filed Jun. 4, 2010 and entitled "AUDIO PORT CONFIGURATION FOR COMPACT ELECTRONIC DEVICES," which is hereby incorporated herein by reference.

Embodiments of the invention are well suited for portable, battery-powered electronic devices, and more particularly handheld battery-powered electronic devices. Examples of portable, battery-powered electronic devices can include laptops, tablet computers, media players, phones, GPS units, remote controls, personal digital assistant (PDAs), and the like.

The various aspects, features, embodiments or implementations of the invention described above can be used alone or in various combinations.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A portable electronic device, comprising:
a housing having an inner surface and an outer surface, the housing having an audio port opening;
a flexible substrate for electrical circuitry provided within the housing, the flexible substrate including a first side and a second side, the flexible substrate including a substrate opening there through;
an audio component coupled to the first side of the flexible substrate adjacent the substrate opening; and
a molded acoustic chamber provided within the housing, the molded acoustic chamber having:
an internal audio channel through the molded acoustic chamber from a first end to a second end, the second end being more compliant than the first end,
wherein the first end of the molded acoustic chamber is acoustically sealed to the second side of the flexible substrate adjacent the substrate opening, and
wherein the second end of the molded acoustic chamber is acoustically sealed to the inner surface of the housing adjacent the audio port opening; and
at least one sealing ring integrally molded with the second end of the internal audio chamber.

2. A portable electronic device as recited in claim 1, wherein the portable electronic device comprises a mesh barrier integrally molded with the second end of the integral audio chamber.

3. A portable electronic device as recited in claim 1, wherein the first end of the molded acoustic chamber is formed in a first mold process, and the second end of the molded acoustic chamber is formed in a second mold process, the second end being integrally molded to the first end.

4. A portable electronic device as recited in claim 3, wherein the molded acoustic chamber comprises a mesh barrier integrally molded with the second end of the integral audio chamber.

5. A portable electronic device as recited in claim 1, wherein the audio port opening includes a recess configured to receive a portion of the second end of the molded acoustic chamber.

6. A portable electronic device as recited in claim 5, wherein the molded acoustic chamber comprises at least one sealing ring integrally molded with the second end of the integral audio chamber, and wherein the sealing ring seal is configured to seal the second end of the molded acoustic chamber to the recess of the audio port opening.

7. A portable electronic device as recited in claim 6, wherein the molded acoustic chamber comprises a mesh barrier integrally molded with the second end of the integral audio chamber.

8. A portable electronic device as recited in claim 7, wherein the mesh barrier is positioned within the recess of the audio port opening.

9. A portable electronic device as recited in claim 1, wherein the audio component is a microphone or a speaker.

10. A portable electronic device as recited in claim 1, wherein the internal audio chamber is tapered such that the internal audio chamber is more narrow at the second end than the first end.

11. A portable electronic device as recited in claim 1, wherein the portable electronic device is a mobile phone or is configured to operate as a mobile phone.

12. A portable electronic device, comprising:
a housing having an inner surface and an outer surface, the housing having an audio port opening;
a flexible substrate for electrical circuitry provided within the housing, the flexible substrate including a first side and a second side, the flexible substrate including a substrate opening there through;
an audio component coupled to the first side of the flexible substrate adjacent the substrate opening;
a molded acoustic chamber provided within the housing, the molded acoustic chamber having an internal audio channel through the molded acoustic chamber from a first end to a second end; and
a mesh barrier integrally molded with the second end of the molded acoustic chamber, wherein the first end of the molded acoustic chamber is acoustically sealed to the second side of the flexible substrate adjacent the substrate opening, and wherein the second end of the molded acoustic chamber is acoustically sealed to the inner surface of the housing adjacent the audio port opening.

13. A portable electronic device as recited in claim 12, wherein the molded acoustic chamber comprises at least one sealing ring integrally molded with the second end of the internal audio chamber.

14. A portable electronic device as recited in claim 12, wherein the audio port opening includes a recess configured to receive a portion of the second end of the molded acoustic chamber.

15. A portable electronic device as recited in claim 14, wherein the molded acoustic chamber comprises at least one sealing ring integrally molded with the second end of the integral audio chamber, and wherein the sealing ring seal is configured to seal the second end of the molded acoustic chamber to the recess of the audio port opening.

16. A method for assembling an audio subsystem for use in a portable electronic device, comprising:
   providing a molded acoustic chamber including:
      at least a first portion having a first end;
      a second portion having a second end;
      an internal audio channel through the molded acoustic chamber from the first end to the second end, wherein the internal audio chamber is tapered such that the internal audio chamber is more narrow at the second end than the first end; and
      a mesh barrier provided within or adjacent the internal audio channel;
   providing a flexible substrate for electrical circuitry, the flexible substrate including a first side and a second side, the flexible substrate including a substrate opening there through;
   attaching an audio component coupled to the first side of the flexible substrate adjacent the substrate opening; and
   acoustically coupling the first end of the molded acoustic chamber to the second side of the flexible substrate adjacent the substrate opening.

17. A method as recited in claim 16, wherein the method further comprises:
   providing a portable electronic device housing having an inner surface and an outer surface, the housing having an audio port opening;
   placing the audio subsystem within the portable electronic device housing; and
   acoustically coupling the second end of the molded acoustic chamber to the inner surface of the portable electronic device housing adjacent the audio port opening.

* * * * *